(12) United States Patent
Lin

(10) Patent No.: US 10,764,994 B2
(45) Date of Patent: Sep. 1, 2020

(54) CIRCUIT BOARDS AND CIRCUIT BOARD ASSEMBLIES

(71) Applicant: Hamilton Sundstrand Corporation, Charlotte, NC (US)

(72) Inventor: Tran Lin, Avon, CT (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 321 days.

(21) Appl. No.: 15/848,576

(22) Filed: Dec. 20, 2017

(65) Prior Publication Data

US 2018/0116047 A1  Apr. 26, 2018

Related U.S. Application Data

(62) Division of application No. 14/947,437, filed on Nov. 20, 2015, now Pat. No. 9,883,582.

(51) Int. Cl.
*G01R 31/70* (2020.01)
*H05K 1/02* (2006.01)
(Continued)

(52) U.S. Cl.
CPC .......... *H05K 1/0268* (2013.01); *G01R 31/50* (2020.01); *G01R 31/70* (2020.01); *H01L 23/15* (2013.01); *H01L 23/3675* (2013.01); *H01L 23/49827* (2013.01); *H01L 23/50* (2013.01); *H05K 1/0206* (2013.01); *H05K 1/0215* (2013.01); *H05K 1/111* (2013.01); *H05K 1/181* (2013.01); *H05K 3/225* (2013.01); *H05K 3/3421* (2013.01); *H05K 2201/094* (2013.01); *H05K 2201/10628* (2013.01); *H05K 2201/10689* (2013.01);
(Continued)

(58) Field of Classification Search
CPC ........ G01R 3/00; G01R 1/04; G01R 1/06722; G01R 27/02; G01R 27/14; G01R 33/09; G01R 31/70; G01R 31/50; H05K 1/0268; H01L 23/15; H01L 23/3675
USPC .... 324/757.02, 691, 763.01, 762.05, 762.01, 324/719, 71.5, 696, 724, 750.3–754.11, 324/754.21–754.26; 361/752, 753, 760, 361/761, 762, 790, 792–795, 799
See application file for complete search history.

(56) References Cited

U.S. PATENT DOCUMENTS 4,802,860 A * 2/1989 Kikuta ................. H01R 12/724
439/79
6,054,767 A * 4/2000 Chia ................... H01L 23/5382
257/691
(Continued)

OTHER PUBLICATIONS

European Search Report received from European Patent Office dated Apr. 10, 2017 for Application No. EP16198932.

*Primary Examiner* — Patrick Assouad
*Assistant Examiner* — Taqi R Nasir
(74) *Attorney, Agent, or Firm* — Locke Lord LLP; Scott D. Wofsy; Judy R. Naamat

(57) ABSTRACT

A printed circuit board includes a body and a belly pad seated within with the body. The belly pad is electrically separated into a first pad and a second pad. The first pad and the second pad are arranged to be electrically connected to one another by an interconnect electrically connecting the belly pad to a conductive plane of an electrical component, thereby allowing continuity testing across an interface between the first pad and the interconnect. Methods of testing continuity in electrical assemblies are also disclosed.

11 Claims, 4 Drawing Sheets

(51) Int. Cl.
  *H05K 3/34*      (2006.01)
  *G01R 31/50*     (2020.01)
  *H01L 23/15*     (2006.01)
  *H01L 23/367*    (2006.01)
  *H01L 23/498*    (2006.01)
  *H01L 23/50*     (2006.01)
  *H05K 1/11*      (2006.01)
  *H05K 1/18*      (2006.01)
  *H05K 3/22*      (2006.01)

(52) U.S. Cl.
  CPC ... *H05K 2203/16* (2013.01); *H05K 2203/162* (2013.01); *Y02P 70/613* (2015.11)

(56) References Cited

U.S. PATENT DOCUMENTS

| | | | | |
|---|---|---|---|---|
| 6,084,432 | A * | 7/2000 | Dreps | H03K 17/164 |
| | | | | 326/21 |
| 7,993,983 | B1 * | 8/2011 | Lin | H01L 24/33 |
| | | | | 438/127 |
| 8,304,292 | B1 * | 11/2012 | Lin | H01L 23/3121 |
| | | | | 438/122 |
| 2008/0158839 | A1 * | 7/2008 | Nishida | H05K 1/111 |
| | | | | 361/767 |
| 2011/0227122 | A1 * | 9/2011 | Lin | H01L 23/3677 |
| | | | | 257/99 |
| 2012/0105096 | A1 | 5/2012 | Kuah et al. | |
| 2013/0222796 | A1 * | 8/2013 | Rocco | G01N 21/956 |
| | | | | 356/237.5 |
| 2014/0043783 | A1 | 2/2014 | Ohira | |
| 2015/0325958 | A1 * | 11/2015 | Weigand | H01R 13/665 |
| | | | | 439/620.22 |

\* cited by examiner

CIRCUIT BOARDS AND CIRCUIT BOARD ASSEMBLIES

CROSS-REFERENCE TO RELATED APPLICATION

This application is a divisional application of U.S. application Ser. No. 14/947,437 filed on Nov. 20, 2015 the contents of which is incorporated herein by reference.

BACKGROUND OF THE INVENTION

1. Field of the Invention

The present disclosure relates to electrical assemblies, and more particularly to circuit board assemblies mounting electrical components like integrated circuits.

2. Description of Related Art

Printed circuit board (PCB) assemblies commonly include a PCB structure and one or more electronic components. The PCB structure typically supports the one or more electronic components mechanically, and includes one or more conductive features formed within the PCB structure. The conductive features, such as tracks or pads, are generally etched from a conductive material like copper or aluminum and electrically connect to the electronic component through a structure like a pin or a jumper. The electrical connection between the electronic component and the conductive features of the PCB structure provide connectivity between the various electronic component(s) within the PCB assembly as well as to other external electronic components. The electrical characteristics of the electrical connection between the electronic component and the conductive feature of the PCB structure can influence the performance of the electronic component and/or the PCB assembly. For example, in some PCB assemblies, the resistance of the electrical connection between the electronic component and the conductive features of the PCB structure can generate heat sufficient to influence the reliability of the electronic component or PCB assembly.

Such conventional methods and systems have generally been considered satisfactory for their intended purpose. However, there is still a need in the art for improved PCB structures and PCB assemblies. The present disclosure provides a solution for this need.

SUMMARY OF THE INVENTION

A printed circuit board (PCB) includes a body and a belly pad seated within with the body. The belly pad is electrically separated into a first pad and a second pad. The first pad and the second pad are arranged to be electrically connected to one another by an interconnect electrically connecting the belly pad to a conductive plane of an electrical component, thereby allowing continuity testing across an interface between the first pad and the interconnect.

In certain embodiments, body can be an electrically insulative body. The insulative body can include a body portion intermediate the first pad and the second pad. The electrically insulative body can electrically separate the first pad from the second pad within the PCB. The PCB can include a ground via. The ground via can be electrically connected to the first pad. The PCB can also include a ground interface disposed on the external face of the PCB, and the ground interface can be electrically connected to the first pad through the ground via, thereby forming a ground trace for connecting the electrical component to an external ground bus. The PCB can include a test via. The test via can be electrically connected to the second pad. The PCB can also include a test interface disposed on an external face of the PCB, and the test interface can be electrically connected to the second pad through the test via, thereby forming a test trace.

In accordance with certain embodiments, the PCB can include a component-mounting surface. The component-mounting surface can include a plurality of pin pads and the belly pad. A plurality of the pin pads can be disposed on opposite sides of the second pad of the belly pad. A plurality of the pin pads can be disposed on opposite sides of the body portion intermediate the first pad and second pad of the belly pad. A plurality of the pin pads can be disposed on opposite sides of the first pad of the belly pad. The second pad can occupy an area of the component-mounting surface of the PCB smaller than an area of the component-mounting surface occupied by the first pad. A portion of the second pad can extend beyond an overlay area of the electrical component and the component-mounting surface of the PCB. The interconnect can overlay a portion of the second pad extending beyond the overlay area of the electrical component and PCB.

It is also contemplated that, in accordance with certain embodiments, the interconnect can be electrically connected to both the first pad and the second pad of the belly pad. The interconnect can span the body portion of the PCB intermediate the first pad and the second pad. The interconnect can overlay and be in intimate mechanical contact with the body portion of the PCB intermediate the first pad and second pad of the belly pad. An electrically conductive interface can be defined between the interconnect and the second pad of the belly pad. An electrically conductive interface can be defined between interconnect and the first pad of the belly pad. An electrically conductive interface can be defined between the interconnect and the conductive plane of the electrical component. An electrically insulating joint can be defined between interconnect and the body portion of the PCB intermediate the second pad and first pad of the belly pad. It is contemplated that continuity across interface between the interconnect and the first pad can be determined using the second pad of the belly pad, such as by applying a voltage across the second pad and first pad, measuring the current flow through the interconnect, and calculating the electrical resistance therethrough.

A method of testing continuity in an electrical assembly as described above includes measuring resistance through an interface defined between the interconnect and the first pad of the belly pad, comparing one or more of the measured resistances against a predetermined resistance value, and reworking the interconnect if one or more of the measured resistances are greater than the predetermined resistance value. In embodiments, the method can also include determining resistance through an interface defined between the interconnect and the second pad of the belly pad that is connected in series with the first pad through the interconnect. In certain embodiments, the method can include measuring resistance through an interface between the interconnect and a conductive plane of an electrical component. In accordance with certain embodiments, resistance can be measured through two of more of the interfaces to determine resistance of one of the interfaces.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION OF THE PREFERRED EMBODIMENTS

Figure 1:
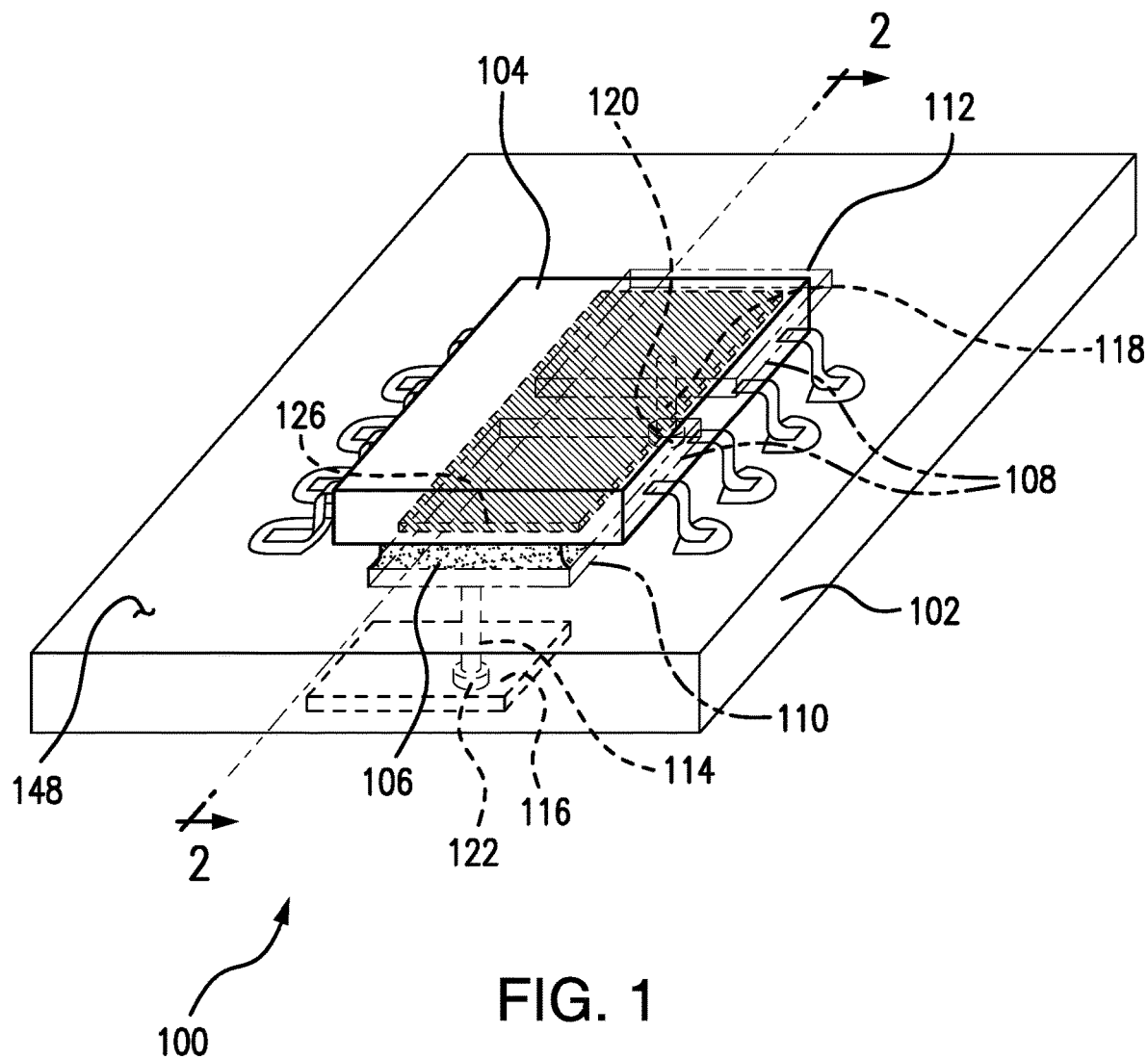
FIG. 1 is a perspective view of an exemplary embodiment of a printed circuit board (PCB) assembly constructed in accordance with the present disclosure, schematically showing an electrical component connected by an interconnect to a belly pad of a PCB.

Reference will now be made to the drawings wherein like reference numerals identify similar structural features or aspects of the subject disclosure. For purposes of explanation and illustration, and not limitation, a partial view of an exemplary embodiment of a printed circuit board (PCB) assembly in accordance with the disclosure is shown in FIG. 1 and is designated generally by reference character 100. Other embodiments of PCB assemblies and methods of making such assemblies, or aspects thereof, are provided in FIGS. 2-4, as will be described. The systems and methods described herein can be used for motor controllers in aircraft electrical systems, however the invention is not limited to either motor controllers or aircraft electrical systems.

Referring to FIG. 1, PCB assembly 100 is shown. PCB assembly 100 includes a PCB 102 mechanically supporting an electrical component 104 and an electrically conductive interconnect 106 connected between the electrical component 104 and PCB 102. PCB 102 includes a plurality of electrically insulative layers (shown as an integral structure for purposes of clarity) laminated together and having therein a plurality of electrically conductive features arranged within the electrically insulative layers. A belly pad 108 is seated within a component-receiving surface 148 of PCB facing electrical component 104. A ground plane 116 is disposed within an interior of PCB 102 and is electrically connected to belly pad 108.

Belly pad 108 includes a first pad 110 and an adjacent second pad 112. Electrical component 104 overlays first pad 110 and second pad 112, and includes a conductive plane 126. Second pad 112 is electrically separated from first pad 110 within PCB 102 by a body portion 136 (shown in FIG. 2) intermediate the first pad 110 and second pad 112 of belly pad 108. A ground via 114 extends from first pad 110 to ground plane 116 within an interior of PCB 102, electrically connecting first pad 110 with ground plane 116. A test via 118 extends from second pad 112 through the interior of PCB 102 to a test interface 120, providing electrical access to second pad 112 from the exterior of PCB 102. Optionally, a ground terminal 122 can be disposed on a side of PCB 102 opposite electrical component 104 and electrically connected to ground plane 116 through ground via 114 to provide electrical access to first pad 110 from the exterior of PCB 102. It is contemplated the plurality insulative layers forming PCB 102 can include a material such as FR-4 glass epoxy. One or more of the electrically conductive features of PCB 102, e.g., belly pad 108, ground plane 116, ground via 116, and/or test via 118, can be formed from copper, such as from etched copper sheet or similar conductive material.

Figure 2:
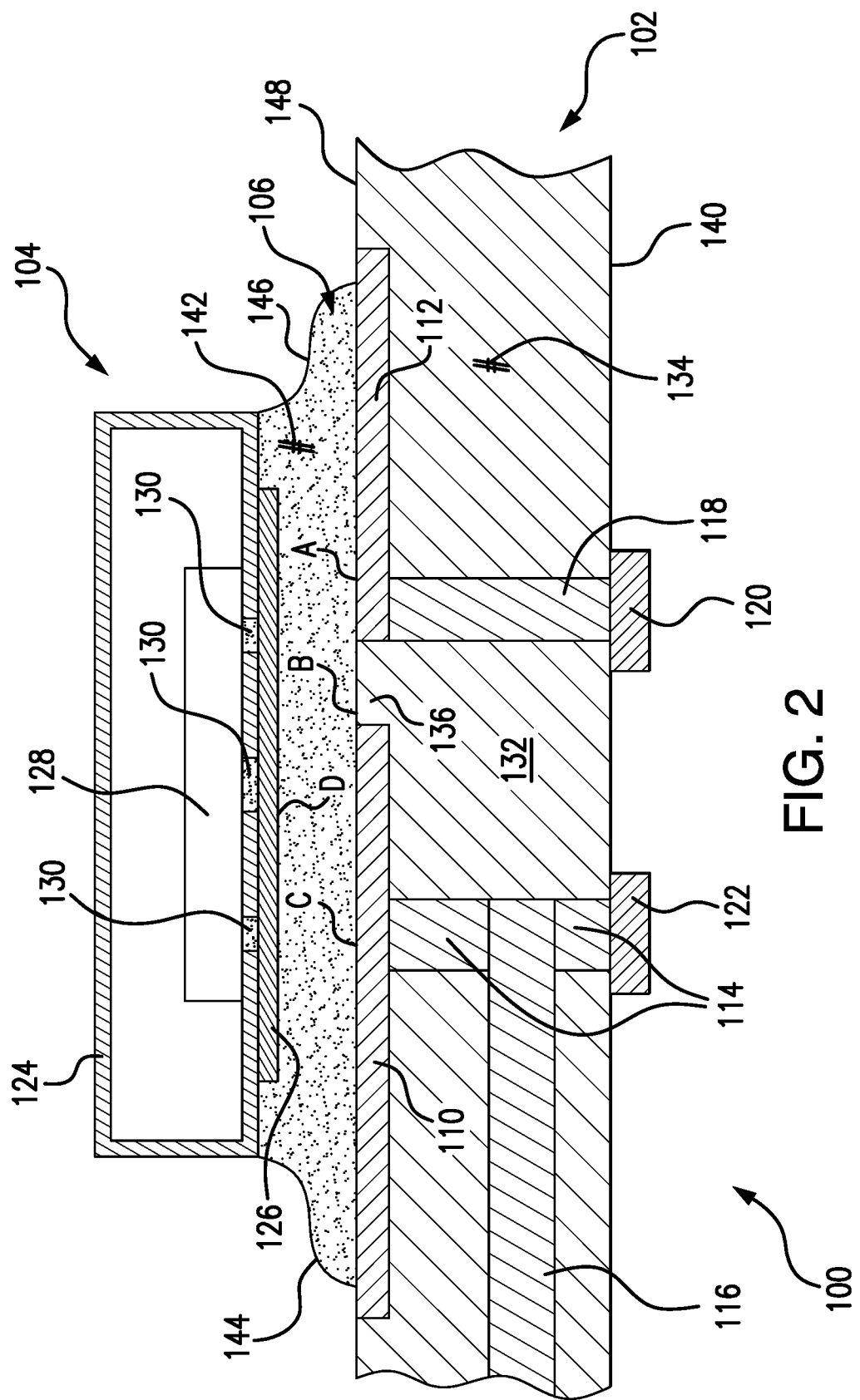
FIG. 2 is a cross-sectional side elevation view of the PCB assembly of FIG. 1, schematically showing the interconnect spanning the belly pad and electrically connecting a first pad with the second pad.

With reference to FIG. 2, electrical component 104, PCB 102, and interconnect 106 are shown. Electrical component 104 includes a housing 124 with an interior and an exterior, a conductive plane 126 disposed on the exterior of housing 124, and a grounded element 128 disposed within the interior of housing 124. It is contemplated that electrical component 104 can be a chip package, housing 124 can be a ceramic housing, and grounded element 128 can include an integrated circuit defined within a silicon body. Conductive plane 126 is disposed on an exterior face of housing 124 facing PCB 102 and a plurality of vias 130 extend through ceramic housing 124 to electrically connect electrical component 104 with conductive plane 126. One or more of the plurality of vias 130 can be a thermal via thermally coupling grounded element 128 with conductive plane 126 for cooling grounded element 128 through PCB 102.

PCB 102 includes an electrically insulative body 132. Electrically insulative body 132 is formed from an electrically insulative material 134 that bounds ground plane 116, ground via 114, and test via 118. Electrically insulative material 134 of insulative body 132 also bounds first pad 110 and second pad 112 on a side of PCB 102 opposite electrical component 104. An intermediate portion 136 of insulative body 132 electrically separates first pad 110 of belly pad 108 from second pad 112 of belly pad 108 within insulative body 132 of PCB 102. Ground plane 116 is disposed within insulative body 132 and is electrically connected to first pad 110 through ground via 114, which in turn extends to a ground terminal 122 disposed on an external surface 140 of PCB 102 to form a ground trace 110/114/122. External surface 140 also includes a test terminal 120, which is connected to second pad 112 by test via 118 and thereby forms a test trace 112/118/120.

Interconnect 106 is formed from an electrically conductive material 142, such as solder or similar material, and is interposed between PCB 102 and electrical component 104. Interconnect 106 spans both first pad 110 of belly pad 108 and second pad 112 of belly pad 108, connecting first pad 110 in electrically in series with second pad 112. Interconnect 106 also spans conductive plane 126 of electrical component 104, electrically connecting conductive plane 126 of electrical component 104 with both first pad 110 of belly pad 108 and second pad 112 of belly pad 108. An electrically conductive interface A is disposed between interconnect 106 and second pad 112 of belly pad 108 that is connected electrically in series with an electrically conductive interface C is disposed between interconnect 106 and first pad 110 of belly pad 108. An electrically conductive interface D is disposed between interconnect 106 and ground plane 116 of electrical component 104, and an electrically insulative joint B is disposed between interconnect 106 and intermediate portion 136 of PCB 102.

As will be appreciated by those of skill in the art in view of the present disclosure, the quality of the ground reference provided to electrical component 104 PCB 102 is influenced by the resistivity of interface C, interconnect 106, and interface D. Belly pad 108 allows for testing electrical continuity across each of these elements by applying voltages across various structures on PCB 102, measuring current flow through the structures, and comparing the measured current to a predetermined value. Based on the comparison, PCB 102 can be dispositioned as suitable for use or requiring rework/or repair, such as by removing and replacing interconnect 106. As will be appreciated, resistance can be determined through the interface defined between interconnect 106 and first pad 110 of belly pad 108, allowing for assessment of the connectivity between the components.

For example, a voltage can be applied across external test terminal 120 and external ground connect 122, and current flow therebetween measured. This provides an indication the resistivity of through interface A, interface C, and interconnect 106. The measured current flow can be compared to a predetermined threshold, and based on the comparison of the measured current flow, determination made regarding continuity across the various interfaces bounded by interconnect 106. Alternatively or additionally, a voltage can be applied to a first face 144 of interconnect 106 and external ground terminal 122 or external test terminal 120, current measured, and resistivity of the intervening interface (e.g., interface C or interface A) inferred from the current flow and compared to a predetermined threshold for disposition. Voltage can be applied to a second face 146 of interconnect 106 and external ground terminal 122 or external test terminal 120, current measured, and resistivity of the intervening interface (e.g., interface C or interface A) inferred from the current flow and compared to a predetermined threshold for disposition. This allows for determining which of the interfaces bounded by interconnect 106 is driving elevated resistance through the interface, simplifying rework by allowing for rework of a portion of the interconnect 106.

Figure 3:
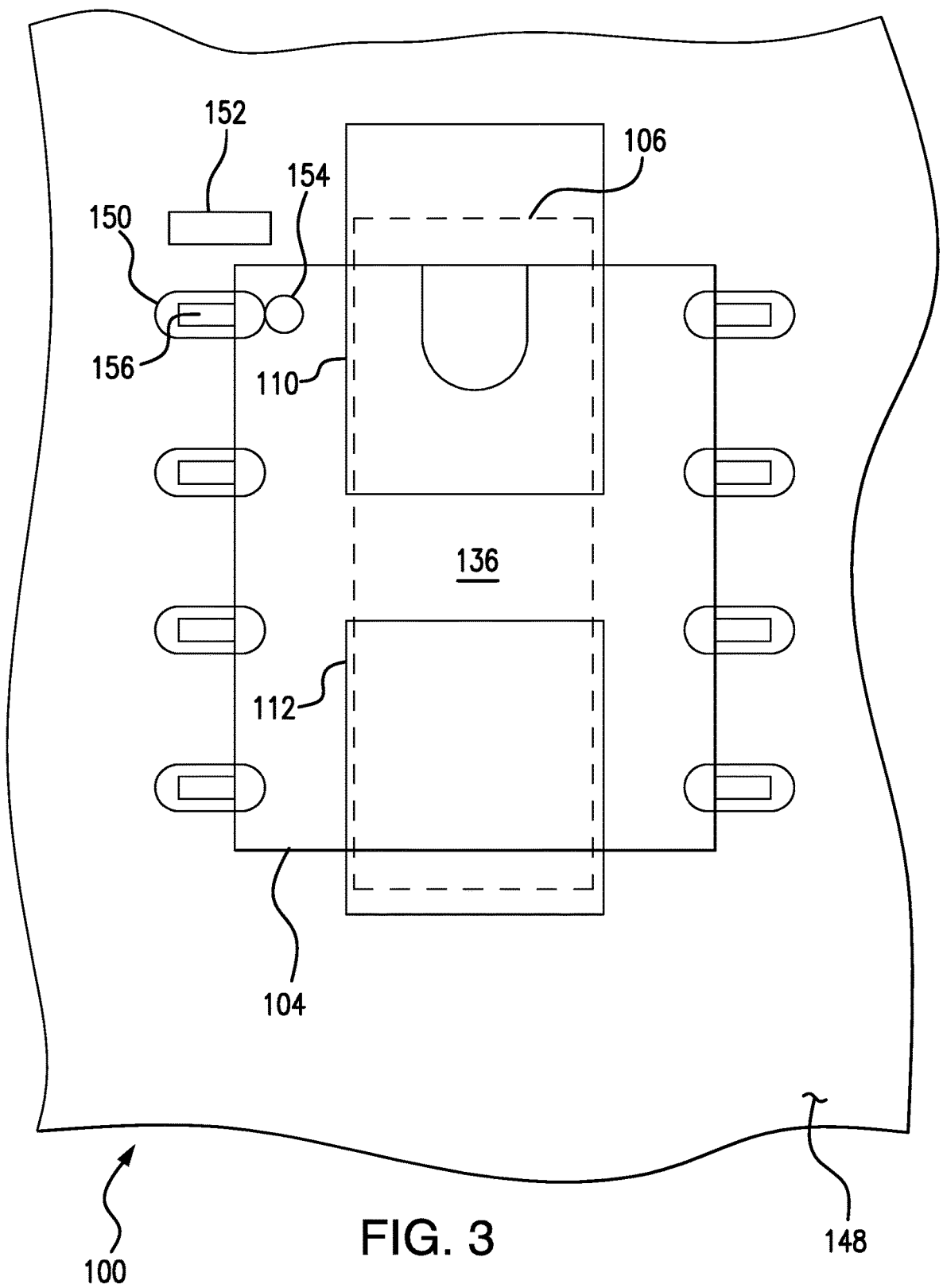
FIG. 3 is a plan view of the PCB assembly of FIG. 1, schematically showing the electrical component and interconnect overlaying belly pad and pin pads arranged on opposite sides of the belly pad.

With reference to FIG. 3, a component-receiving surface 148 of PCB 102 is shown. Surfaces of first pad 110, electrically intermediate body portion 136, and second pad 112 are disposed within component-receiving surface 148. Pin pads 150 (only one identified for purposes of clarity) are also defined within component-receiving surface 148 and are electrically isolated from conductive plane 126 (shown in FIG. 2). PCB 102 also includes a pin 1 locating indicator 152 arranged adjacent to pin 1 pad of PCB 102, facilitating assembly of PCB 102 by allowing alignment of pin 1 indicator 154 of electrical component 104 with PCB 102 for coupling a first pin 156 between electrical component 104 and PCB 102.

Electrical component 104 overlays component-receiving surface 148 of PCB 102 such that electrical component 104 laterally spans first pad 110 and second pad 112. A pair of pin pads 150 are disposed on laterally opposite sides of first pad 110. A pair of pin pads 150 are also disposed on laterally opposite sides of body portion 136. A pair of pin pads 150 are additionally disposed on laterally opposite sides of second pad 112.

Belly pad 108 is disposed within the overlay area defined between electrical component 104 and PCB 102. A portion of first pad 110 extends beyond the overlap area between electrical component 104 and PCB 102, providing a test location that allows for acquiring current measurements for assessing the continuity across individual interfaces within PCB assembly 100. Similarly, a portion of second pad 112 extends beyond the overlap, area between electrical component 104 and PCB 102, providing a further test location that allows for acquiring current measurements for assessing the continuity across individual interfaces within PCB assembly 100. In the illustrated exemplary embodiment, first pad 110 has a greater area than second pad 112. The greater area of first pad 110 allows first pad 110 to serve as a heat sink for electrical component 104, notwithstanding the relative area occupied by second pad 112.

Figure 4:
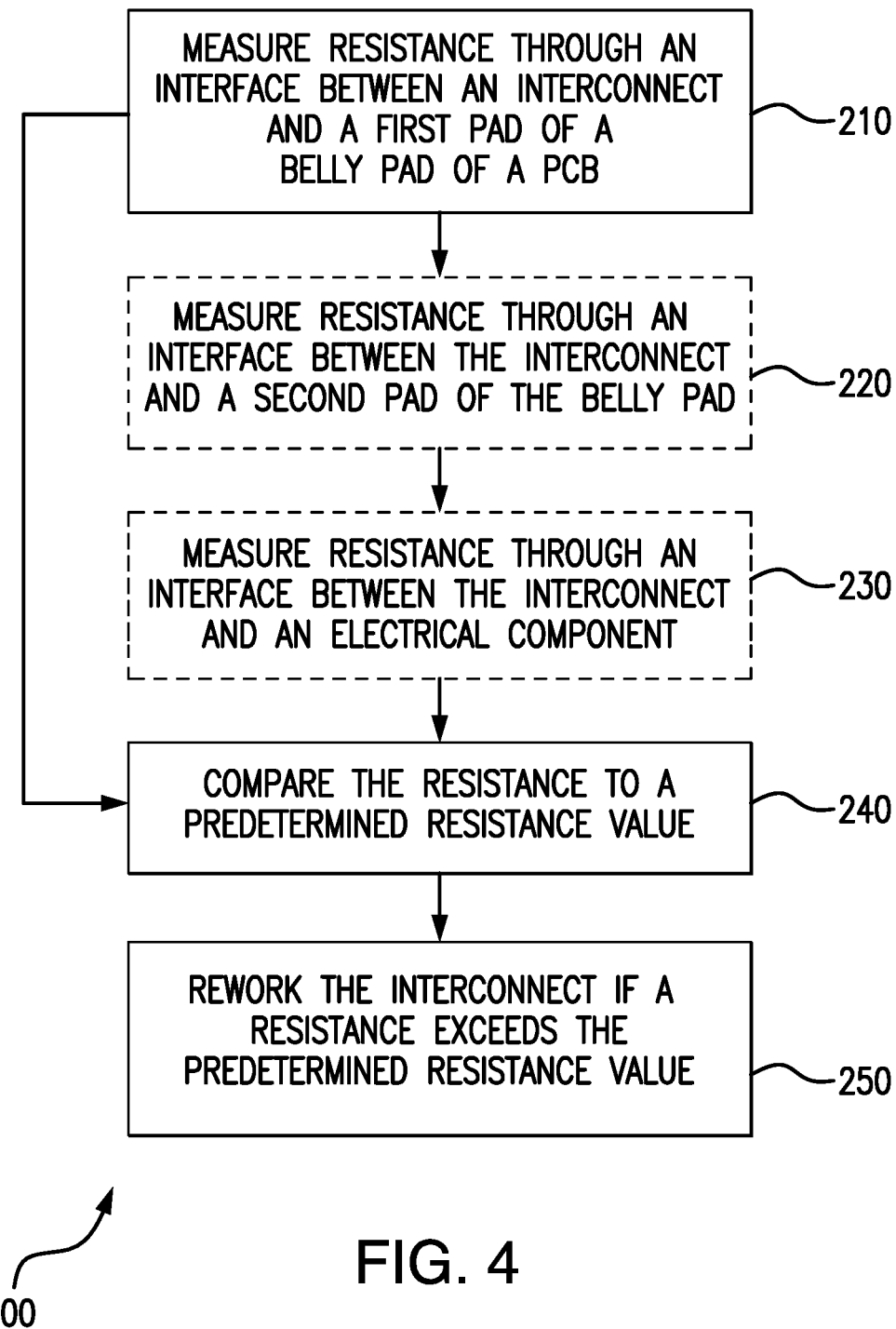
FIG. 4 is a diagram of a method of testing the electrical connectivity between the interconnect and the PCB using the first pad and the second pad of the belly pad.

With reference to FIG. 4, a method testing continuity in an electrical assembly, e.g., PCB assembly 100 (shown in FIG. 1) is generally indicated with reference numeral 200. Method 200 includes measuring resistance through an interface between a second pad and an interconnect, e.g., first interface A shown in FIG. 2, disposed between a second pad, e.g., second pad 112 (shown in FIG. 1), and an interconnect, e.g., interconnect 106 (shown in FIG. 1), as shown with box 210. Method 200 also includes measuring resistance through an interface between a first pad and an interconnect, e.g., third interface C (shown in FIG. 2) disposed between a first pad, e.g. first pad 110 (shown in FIG. 1), and the interconnect, as shown with box 220. Method 200 further includes measuring resistance in a circuit including a conduction plane of an electrical component and the interconnect, e.g., conductive plane 126 of electrical component 104 (shown in FIG. 1) disposed between an electrical component and the interconnect, as shown with box 230.

Once current has been measured and/or resistance determined, the current measurement and/or calculated resistance can be compared against a predetermined value, as shown with box 240. Based on the comparison, the interconnect can be reworked in the event that current flow is too low and/or resistance too high, as shown with box 250. In embodiments, the method includes acquiring at least current measurement and/or calculating one resistance value. In certain embodiments, the method includes acquiring a plurality of current measurements and/or calculating a plurality of resistances using measurements acquired at different locations, and determining continuity through individual interfaces to disposition the assembly.

The methods and systems of the present disclosure, as described above and shown in the drawings, provide for electrical assemblies with superior properties including an assembly interconnect that is testable at the piece part level. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A method of testing continuity in an electrical assembly, comprising:
    at a printed circuit board (PCB) assembly comprising a body having a component-receiving surface and an opposite external surface, a belly pad seated in the component-receiving surface body and electrically separated into a first pad and a second pad, and an electrical component connected to the component-receiving surface of the PCB by an interconnect, wherein an interconnect portion extends over the first pad outside of an overlay area defined between an electrical component and a PCB;
    measuring resistance through an interface defined between the interconnect and the first pad of the belly pad;
    comparing the resistance with a predetermined resistance value; and
    reworking the interconnect if the measured resistance is greater than the predetermined resistance value.

2. The method as recited in claim 1, further comprising measuring resistance through an interface between the interconnect and the second pad of the belly pad, wherein the second pad is connected in series with the first pad through the interconnect.

3. The method as recited in claim 2, further comprising measuring resistance through an interface between the interconnect and the second pad of the belly pad.

4. The method as recited in claim 3, further comprising comparing the measured resistance through the interface between the interconnect and the second pad of the belly pad to a predetermined value.

5. The method as recited in claim 3, further comprising reworking the interconnect if the measured resistance through the interface between the interconnect and the second pad of the belly pad exceeds the predetermined resistance value.

6. The method as recited in claim 1, further comprising measuring resistance through an interface between the interconnect and the electrical component, wherein the electrical component is connected in series with the second pad of the belly pad through the interconnect.

7. The method as recited in claim 6, further comprising comparing the measured resistance through the interface between the interconnect and the electrical component to a predetermined value.

8. The method as recited in claim 6, further comprising reworking the interconnect if the measured resistance through the interface between the interconnect and electrical component exceeds the predetermined resistance value.

9. The method as recited in claim 1, wherein reworking includes reworking only a portion of the interconnect.

10. A method of testing continuity in an electrical assembly, comprising:
   at a printed circuit board (PCB) assembly comprising a body having a component-receiving surface and opposite external surface, and a belly pad seated in the component-receiving surface body and electrically separated into a first pad and a second pad, and an electrical component connected to the component receiving surface of the PCB by an interconnect, wherein an interconnect portion extends over the first pad outside of an overlay area defined between an electrical component and a PCB;
   measuring resistance through an interface defined between the interconnect and the first pad of the belly pad;
   comparing the resistance through the interface defined between the interconnect and the first pad of the belly pad with a predetermined resistance value;
   measuring resistance through an interface defined between the interconnect and the second pad of the belly pad;
   comparing the resistance the interface defined between the interconnect and the second pad of the belly pad with a predetermined resistance value; and
   reworking the interconnect if (a) the resistance the interface defined between the interconnect and the first pad of the belly pad exceeds a predetermined resistance value, or (b) the resistance the interface defined between the interconnect and the second pad of the belly pad exceeds the predetermined resistance value.

11. A method of testing continuity in an electrical assembly, comprising:
   at a printed circuit board (PCB) assembly comprising a body having a component-receiving surface and opposite external surface, and a belly pad seated in the component-receiving surface body and electrically separated into a first pad and a second pad, and an electrical component connected to the component receiving surface of the PCB by an interconnect, wherein an interconnect portion extends over the first pad outside of an overlay area defined between an electrical component and a PCB;
   measuring resistance through an interface defined between the interconnect and the first pad of the belly pad;
   comparing the resistance through the interface defined between the interconnect and the first pad of the belly pad with a predetermined resistance value;
   measuring resistance through an interface defined between the interconnect and the second pad of the belly pad;
   comparing the resistance the interface defined between the interconnect and the second pad of the belly pad with a predetermined resistance value;
   measuring resistance through an interface defined between the electrical component and the interconnect;
   comparing the resistance the interface defined between the electrical component and the interconnect; and
   reworking the interconnect if (a) the resistance the interface defined between the interconnect and the first pad of the belly pad exceeds a predetermined resistance value, (b) the resistance the interface defined between the interconnect and the second pad of the belly pad exceeds the predetermined resistance value, or (c) the resistance between the electrical component and the intercomlect exceeds the predetermined resistance value.

* * * * *